(12) United States Patent
Li et al.

(10) Patent No.: US 10,558,839 B2
(45) Date of Patent: Feb. 11, 2020

(54) REDUCED THICKNESS TOUCH SENSING PATTERN RECOGNITION ARRAY SUBSTRATE, SENSING UNIT, SENSOR, APPARATUS, AND FABRICATING METHOD THEREOF

(71) Applicants: BOE TECHNOLOGY GROUP CO., LTD, Beijing (CN); BEIJING BOE OPTOELECTRONICS TECHNOLOGY CO., LTD., Beijing (CN)

(72) Inventors: Changfeng Li, Beijing (CN); Xue Dong, Beijing (CN); Haisheng Wang, Beijing (CN); Xiaochuan Chen, Beijing (CN); Yingming Liu, Beijing (CN); Shengji Yang, Beijing (CN); Xiaoliang Ding, Beijing (CN); Lei Wang, Beijing (CN); Rui Xu, Beijing (CN); Jingbo Xu, Beijing (CN); Hongbo Feng, Beijing (CN); Jiantao Liu, Beijing (CN); Yingzi Wang, Beijing (CN); Minqiang Yang, Beijing (CN)

(73) Assignees: BOE Technology Group Co., Ltd., Beijing (CN); BEIJING BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 15/122,909

(22) PCT Filed: Feb. 22, 2016

(86) PCT No.: PCT/CN2016/074267
§ 371 (c)(1),
(2) Date: Aug. 31, 2016

(87) PCT Pub. No.: WO2017/016219
PCT Pub. Date: Feb. 2, 2017

(65) Prior Publication Data
US 2017/0161541 A1    Jun. 8, 2017

(30) Foreign Application Priority Data
Jul. 29, 2015 (CN) .......................... 2015 1 0456964

(51) Int. Cl.
*G06K 9/00* (2006.01)
*H01L 27/146* (2006.01)

(52) U.S. Cl.
CPC ...... *G06K 9/0004* (2013.01); *H01L 27/14629* (2013.01); *H01L 27/14678* (2013.01); *H01L 27/14689* (2013.01); *H01L 27/14692* (2013.01)

(58) Field of Classification Search
CPC ............... G06K 9/0004; G06K 9/0006; H01L 27/14678; H01L 27/14689; H01L 27/14692
See application file for complete search history.

(56) References Cited

U.S. PATENT DOCUMENTS 5,708,497 A * 1/1998 Fujieda ................ G06K 9/0004
250/556
6,087,648 A * 7/2000 Zhang ................. G02F 1/13454
250/208.1
(Continued)

FOREIGN PATENT DOCUMENTS

CN        1256773 A      6/2000
CN      203930869 U    11/2014
(Continued)

OTHER PUBLICATIONS

State Intellectual Property Office of the P.R.C (SIPO) Office Action 1 for 201510456964.1 dated Jan. 26, 2018 10 Pages. (including translation).
(Continued)

*Primary Examiner* — Laura M Menz
*Assistant Examiner* — Candice Chan
(74) *Attorney, Agent, or Firm* — Westerman, Hattori, Daniels & Adrian, LLP; Stephen B. Parker (57) ABSTRACT

In some embodiments of the disclosed subject matter, a touch sensing pattern recognition array substrate, and related unit, sensor, apparatus, and fabricating method are provided. The sensing unit on the touch sensing pattern recognition array substrate comprises a thin film transistor part and a photosensitive part. The photosensitive part comprises an opaque electrode, a transparent electrode, and a photosen-
(Continued)

sitive layer sandwiched by the opaque electrode and the transparent electrode. The thin film transistor part comprises a gate electrode connected with a scanning line, a source electrode connected with a signal line, and a drain electrode connected with the photosensitive layer of the photosensitive part.

16 Claims, 4 Drawing Sheets

(56) References Cited

U.S. PATENT DOCUMENTS

| | | | |
|---|---|---|---|
| 6,414,297 | B1 | 7/2002 | Sasaki et al. |
| 6,952,490 | B2 | 10/2005 | Lee |
| 2002/0054696 | A1 | 5/2002 | Lee |
| 2003/0183019 | A1* | 10/2003 | Chae .................... G06K 9/0004 |
| | | | 73/862.624 |
| 2006/0011913 | A1* | 1/2006 | Yamazaki ............. G06F 3/0412 |
| | | | 257/59 |
| 2012/0321149 | A1* | 12/2012 | Carver ................ G06K 9/0004 |
| | | | 382/124 |
| 2017/0161541 | A1 | 6/2017 | Li et al. |

FOREIGN PATENT DOCUMENTS

| | | |
|---|---|---|
| CN | 104252277 A | 12/2014 |
| CN | 104408441 A | 3/2015 |
| CN | 105095872 A | 11/2015 |
| CN | 204808361 U | 11/2015 |

OTHER PUBLICATIONS

The World Intellectual Property Organization (WIPO) International Search Report and Written Opinion for PCT/CN2016/074267 dated May 23, 2016 12 Pages.

* cited by examiner

REDUCED THICKNESS TOUCH SENSING PATTERN RECOGNITION ARRAY SUBSTRATE, SENSING UNIT, SENSOR, APPARATUS, AND FABRICATING METHOD THEREOF

CROSS-REFERENCES TO RELATED APPLICATIONS

This PCT patent application is a national phase entry under 35 U.S.C. § 371 of International Application No. PCT/CN2016/074267, filed on Feb. 22, 2016, which claims priority of Chinese Patent Application No. 201510456964.1, filed on Jul. 29, 2015. The above enumerated patent applications are incorporated by reference herein in their entirety.

TECHNICAL FIELD

The disclosed subject matter generally relates to the fingerprint recognition technologies and, more particularly, relates to a touch sensing pattern recognition array substrate, a touch sensing pattern recognition unit, a related touch sensing pattern recognition sensor, a related touch sensing pattern recognition apparatus, and a related fabricating method.

BACKGROUND

Human fingerprint is an innate, unique, and invariant feature that can be used for distinguishing individuals. A fingerprint includes patterns, which are aggregate characteristics of ridges and furrows on the skin surface of a finger. The three basic patterns of fingerprint ridges are the arch, loop, and whorl. A fingerprint pattern can include many minutia features, such as ridge endings, ridge bifurcations, arches, tented arches, left-handed whorls, right-handed whorls, double whorls, and other details, which can determine the uniqueness of the fingerprint pattern.

Along with the development of the pattern recognition theories, many fingerprint recognition apparatus have been developed. However, the existing fingerprint recognition apparatus are usually not thin enough to meet market demand.

BRIEF SUMMARY

In accordance with some embodiments of the disclosed subject matter, a touch sensing pattern recognition array substrate, a touch sensing pattern recognition unit, a related touch sensing pattern recognition sensor, a related touch sensing pattern recognition apparatus, and a related fabricating method are provided.

An aspect of the present disclosure provides a sensing unit on a touch sensing pattern recognition array substrate. In some embodiments, the sensing unit includes a thin film transistor part and a photosensitive part. The photosensitive part comprises an opaque electrode, a transparent electrode, and a photosensitive layer sandwiched by the opaque electrode and the transparent electrode. The thin film transistor part comprises a gate electrode connected with a scanning line, a source electrode connected with a signal line, and a drain electrode connected with the photosensitive layer of the photosensitive part.

In some embodiments, a projection of the opaque electrode on the array substrate covering a projection of the photosensitive layer on the array substrate.

In some embodiments, the photosensitive layer is made of a material selected from one of amorphous silicon and low-temperature polysilicon.

In some embodiments, the thin film transistor part further comprises an active layer; and the photosensitive layer and the active layer are formed in a single patterning process.

In some embodiments, the opaque electrode and the gate electrode are formed in a single patterning process.

In some embodiments, the opaque electrode and the source electrode are formed in a single patterning process.

In some embodiments, the transparent electrode overlaps with the drain electrode and has non-overlapping region with the source electrode.

In some embodiments, the photosensitive layer is in contact with the opaque electrode and the transparent electrode.

In some embodiments, the sensing unit further comprises: a resin layer between the transparent electrode of the photosensitive part and the drain electrode and the source electrode of the thin film transistor part, the transparent electrode being connected with the photosensitive layer through a via hole in the resin layer.

Another aspect of the present disclosure provides a touch sensing pattern recognition array substrate including a plurality of disclosed sensing units.

In some embodiments, the opaque electrodes of the plurality of sensing units in a row are connected with each other.

In some embodiments, the transparent electrodes of the plurality of sensing units in a row are connected with each other.

Another aspect of the present disclosure provides a touch sensing pattern recognition sensor, comprising: a disclosed touch sensing pattern recognition array substrate; a light total internal reflection element on one side of the transparent electrode distal to the photosensitive layer; and a light source to provide light transmitting into the light total internal reflection element.

In some embodiments, the light total internal reflection element comprises a light guide plate.

In some embodiments, the light source is configured on one side of the light guide plate.

In some embodiments, the light source comprising a plurality of emitting elements on one side of the opaque electrode distal to the photosensitive layer; and each emitting element is between adjacent opaque electrodes.

Another aspect of the present disclosure provides a touch sensing pattern recognition apparatus, comprising: a disclosed touch sensing pattern recognition sensor; and a reading apparatus connected with the signal line for identifying touch sensing pattern information in response to receiving a signal from the signal line.

Another aspect of the present disclosure provides a method for fabricating a touch sensing pattern recognition array substrate, comprising: forming a gate electrode of a thin film transistor part, and a scanning line connecting to the gate electrode on a base substrate; forming an opaque electrode of a photosensitive part on the base substrate; forming an active layer of the thin film transistor part; forming a photosensitive layer of the photosensitive part, wherein the photosensitive layer is connected to the opaque electrode; forming a source electrode and a drain electrode of the thin film transistor part, and a signal line connecting with the source electrode by a single fabricating step over the active layer and the photosensitive layer, wherein the drain electrode is connected to the photosensitive layer of the photosensitive part; and forming a transparent electrode of the photosensitive part, wherein the transparent electrode is connected to the photosensitive layer.

In some embodiments, the photosensitive layer is made of a material selected from one of amorphous silicon and low-temperature polysilicon.

In some embodiments, the photosensitive layer and the active layer are formed in a single patterning process.

In some embodiments, the opaque electrode of photosensitive part, the scanning line, and the gate electrode of the thin film transistor part are formed in a single patterning process.

In some embodiments, the method further comprises: forming a first insulating layer over the gate electrode, the scanning line, and the opaque electrode, wherein: the first insulating layer comprises a first via hole that exposes the opaque electrode, and the photosensitive layer is connected to the opaque electrode though the first via hole.

In some embodiments, the method further comprises: forming a second insulating layer over the source electrode, the drain electrode, and the signal line, wherein: the second insulating layer comprises a second via hole that exposes the photosensitive layer, and the transparent electrode is connected to the photosensitive layer through the second via hole.

Another aspect of the present disclosure provides a method for fabricating a touch sensing pattern recognition sensor, comprising: forming a disclosed array substrate; providing a light source; and placing a light total internal reflection element on one side of the transparent electrode distal to the photosensitive layer.

Another aspect of the present disclosure provides a method for fabricating a touch sensing pattern recognition apparatus, comprising: forming a disclosed touch sensing pattern recognition sensor; and forming a reading apparatus connected to the signal line for identifying touch sensing pattern information in response to receiving a signal from the signal line.

Other aspects of the present disclosure can be understood by those skilled in the art in light of the description, the claims, and the drawings of the present disclosure.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of the present disclosure.

DETAILED DESCRIPTION

For those skilled in the art to better understand the technical solution of the disclosed subject matter, reference will now be made in detail to exemplary embodiments of the disclosed subject matter, which are illustrated in the accompanying drawings. Wherever possible, the same reference numbers will be used throughout the drawings to refer to the same or like parts.

In accordance with various embodiments, the disclosed subject matter provides a touch sensing pattern recognition array substrate, a touch sensing pattern recognition unit, a related touch sensing pattern recognition sensor, a related touch sensing pattern recognition apparatus, and a related fabricating method.

Figure 1:
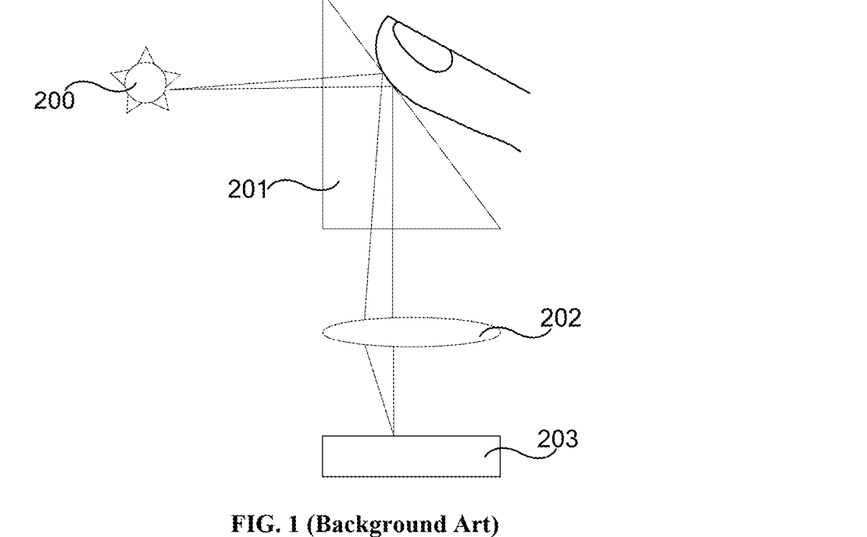
FIG. 1 is a schematic structure diagram of a fingerprint recognition apparatus.
Figure 2:
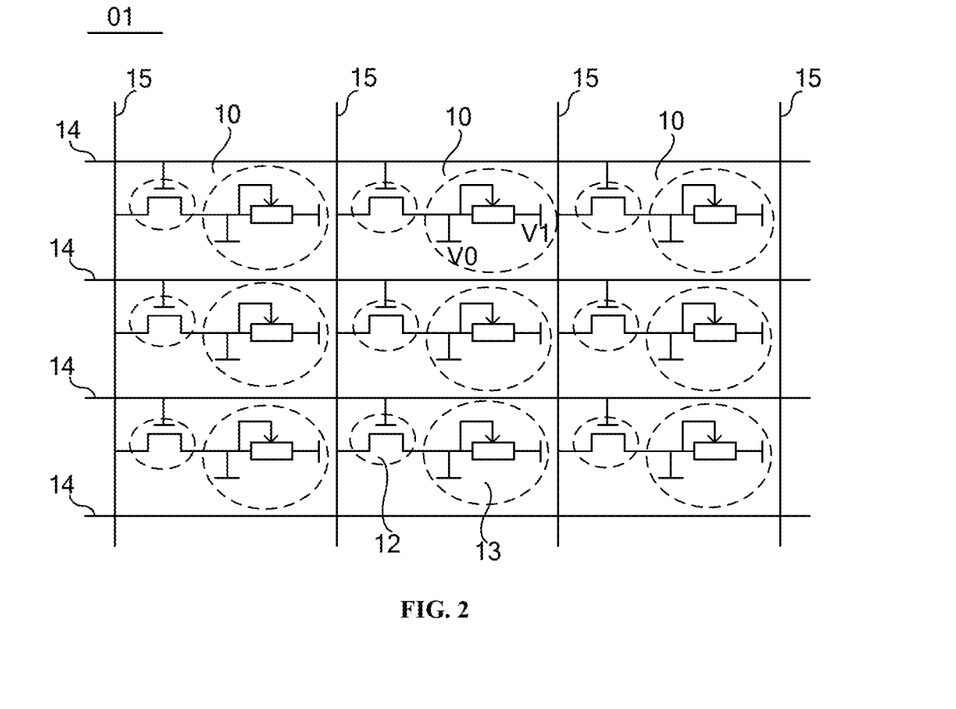
FIGS. 2 and 3 are schematic structure diagrams of a touch sensing pattern recognition array substrate in accordance with some embodiments of the disclosed subject matter.

FIG. 1 shows a schematic structure diagram of an existing fingerprint recognition apparatus. As illustrated in FIG. 1, the fingerprint recognition apparatus usually includes a light source 200, a prism 201, a focusing lens 202, and an image sensor 203. Emitted light from light source 200 can transmit trough prism 201 and be reflected by the uneven skin texture of a finger. The reflected light can transmit through prism 201 again, then go through focusing lens 202 to focus and form an image on image sensor 203. Since the ridges and the furrows of a fingerprint have different refraction angles, the reflected light by the ridges and the furrows may have different intensities. The reflected light can be projected on image sensor 203 and form a fingerprint image.

However, in the above describe apparatus, any one of prism 201, focusing lens 202, image sensor 203 can occupy a relatively large space. Additionally, in order to ensure proper imaging, prism 201 and focus lens 202 should be set apart for at least a certain distance, and focusing lens 202 and image sensor 203 should be set apart for at least a certain distance as well. Therefore, the fingerprint recognition apparatus may be relatively thick, which does not meet the market demand for thin and light apparatus.

Figure 3:
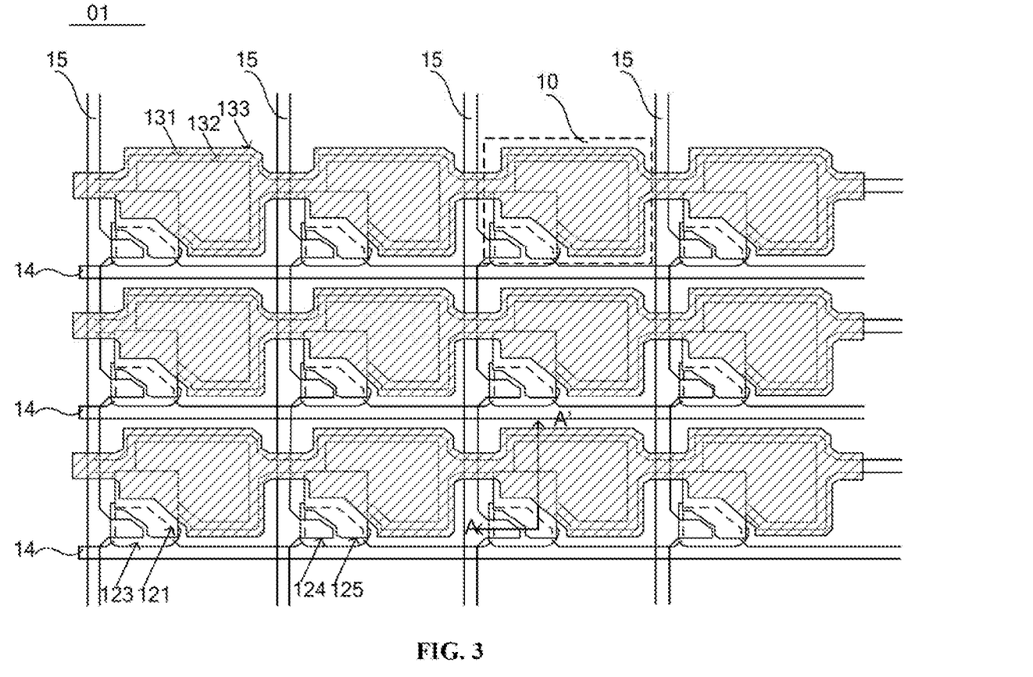
Figure 4:
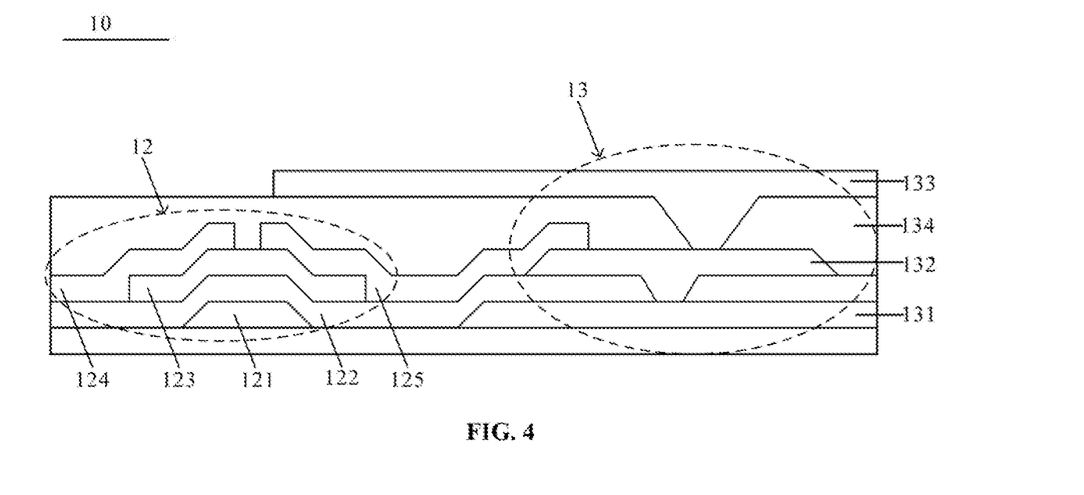
FIG. 4 is a cross-sectional structure diagram of the touch sensing pattern recognition array substrate along the AA' direction in FIG. 3 in accordance with some embodiments of the disclosed subject matter.

Referring to FIGS. 3 and 4, two schematic structure diagrams of a touch sensing pattern recognition array substrate 01 are shown in accordance with some embodiments of the disclosed subject matter. As illustrated in the figures, touch sensing pattern recognition array substrate 01 may include multiple sensing units 10 arranged in an array on a base substrate. Each sensing unit 10 may include a thin film transistor part 12 and a photosensitive part 13.

In some embodiments, the photosensitive part 13 may include a photosensitive layer 132 between an opaque electrode 131 and a transparent electrode 133. Opaque electrode 131 is on one side of photosensitive layer 132, and transparent electrode 133 is on the other side of photosensitive layer 132. Photosensitive layer 132 is directly connected with opaque electrode 131 and transparent electrode 133. Opaque electrode 131 can block light from transmitting into photosensitive layer 132.

In some embodiments, thin film transistor part 12 may include a gate electrode 121 that is connected with a scanning line 14, a semiconductor active layer 123, a source electrode 124 that is connected with a signal line 15, and a drain electrode 125 that is connected with photosensitive layer 132 of photosensitive part 13.

In some embodiments, multiple gate electrodes 121 of a subset of multiple sensing units 10 that are in a row are connected with one scanning line 14. Multiple source electrodes 124 of a subset of multiple sensing units 10 that are in a column are connected with one signal line 15.

Based on the principles of light reflection, when a finger touches a screen that contains touch sensing pattern recognition array substrate 01, the light emitted from a light source 20 can be reflected by the furrow lines and ridge lines of the fingerprint of the finger. The reflected light can be projected on photosensitive layer 132 of photosensitive part 13. Since the furrow lines and ridge lines of the fingerprint have different refraction angles and can reflect light with different intensities, the reflection can cause different changes in the resistance of photosensitive layer 132. For example, opaque electrode 131 has a fixed potential V0 and transparent electrode 133 has a fixed potential V1. A current goes through photosensitive layer 132 can be changed by the reflected light. The current goes through thin film transistor part 12 when it is in a conductive state, and can be transmitted to a current readable apparatus by signal line 15. Thus, the current readable apparatus can identify the furrow lines and the ridge lines of the fingerprint based on the current transmitted by the signal line 15.

It should be noted that, opaque electrode 131 can prevent light transmitting into photosensitive layer 132 from its side. Opaque electrode 131 can be used as a light shield for photosensitive layer 132, and can prevent the resistance of photosensitive layer 132 from being changed by an external light. That is, only the reflected light transmitted by transparent electrode 133 can reach photosensitive layer 132.

Photosensitive layer 132 can be formed by any suitable material that has a variable resistance based on the intensity of the incident light. Opaque electrode 131 can be made of an opaque metal material.

In some embodiments, gate electrode 121, source electrode 124, and drain electrode 125 of thin film transistor part 12 can be made of an opaque metal material. In order to simplify the fabricating process, in one embodiment, opaque electrode 131, gate electrode 121, source electrode 124, and drain electrode 125 can be formed in a single patterning process.

It should be noted that, based on the principle described above, the disclosed subject matter can be used not only for fingerprint recognitions, but also for palmprint and other pattern recognitions.

Sensing unit 10 can be of any suitable size that is determined by a distance between two adjacent ridge lines and a distance between two adjacent furrow lines of a human fingerprint. In some embodiments, one side of sensing unit 10 is shorter than a minimum distance between two adjacent ridges or furrows of a human fingerprint. For example, sensing unit 10 can be 50 µm×50 µm.

In some embodiments, source electrode 124 and drain electrode 125 in thin film transistor part 12 are symmetrical. So source electrode 124 and drain electrode 125 may be identical and can be exchanged with each other. Besides gate electrode 121, in order to distinguish the other two electrodes of thin film transistor part 12, one of them can be called source electrode 124, and the other one can be called drain electrode 125.

In some embodiments, thin film transistor part 12 can be either an N-type thin film transistor, or a P-type double-type thin film transistor. In some embodiments, based on different forming sequence of semiconductor active layer 123, source electrode 124, and drain electrode 125, thin film transistor part 12 can be a stagger type thin film transistor, a reverse stagger type thin film transistor, a coplanar type thin film transistor, an inverted coplanar type thin film transistor, etc.

In some embodiments, multiple opaque electrodes 131 of a subset of multiple sensing units 10 that are in a row are electrically connected with each other. Based on this configuration, touch sensing pattern recognition array substrate 01 can further include multiple opaque electrodes connecting lines that are respectively connected with multiple opaque electrodes 131 in each row of touch sensing pattern recognition array substrate 01. The multiple opaque electrodes connecting lines can be used for providing a voltage for multiple opaque electrodes 131.

In some embodiments, multiple transparent electrodes 133 of a subset of multiple sensing units 10 that are in a row are electrically connected with each other. Based on this configuration, touch sensing pattern recognition array substrate 01 can further include multiple transparent electrodes connecting lines that are respectively connected with multiple transparent electrodes 133 in each row of touch sensing pattern recognition array substrate 01. The multiple transparent electrodes connecting lines can be used for providing a voltage for multiple transparent electrodes 133.

In some embodiments, touch sensing pattern recognition array substrate 01 may have a sensing region and a wiring region located at the periphery of the sensing region. The multiple sensing units 10 can be located in the sensing region, and the multiple opaque electrodes connecting lines and the multiple transparent electrodes connecting lines can be located in the wiring region.

In some embodiments, the subset of multiple sensing units 10, which are in a row as described above, are a row of sensing units 10 that are parallel to a scanning line 14.

Turning to FIG. 4, a cross-sectional structure diagram of the touch sensing pattern recognition array substrate along the AA' direction in FIG. 3 is shown in accordance with some embodiments of the disclosed subject matter.

In some embodiments, the material of the photosensitive layer 132 can be amorphous silicon or low temperature polysilicon.

In some embodiments, in order to reduce the number of patterning processes, photosensitive layer 132 of photosensitive part 13 and semiconductor active layer 123 of thin film transistor part 12 can be formed in a single patterning process and in a same layer, as illustrated in FIG. 4.

In some embodiments, in order to reduce the number of steps in patterning processes, opaque electrode 131 of photosensitive part 13 and gate electrode 121 of thin film transistor part 12 can be formed in a single patterning process and in a same layer, as illustrated in FIG. 4.

It should be noted here that, for each sensor unit 10 in the vertical direction of the substrate, if transparent electrode 133 is overlapping with thin film transistor part 12, it may produce parasitic capacitances with the electrodes of thin film transistor part 12. Therefore, the overlap between transparent electrode 133 and thin film transistor part 12 should be minimized in the fabricating processes. Since drain electrode 125 is in contact with photosensitive layer 132, transparent electrode 133 inevitably overlaps with drain electrode 125. Therefore, the overlap of transparent electrode 133 with source electrode 124 should be avoided.

In some embodiments, resin layer 134 can be formed for preventing mutual influences between transparent electrode 133 and source electrode 124 as well as drain electrode 125 of thin film transistor part 12. Comparing to layers formed by inorganic materials, resin layer 134 that is formed by an organic material may be thicker. The parasitic capacitances between transparent electrode 133 and source electrode 124 and drain electrode 125 may be reduced if the thickness of resin layer 134 is increased.

Referring to FIGS. 3 and 4, touch sensing pattern recognition array substrate 01 can include multiple sensing units 10 arranged in an array on a base substrate.

Each of the multiple sensing units 10 can include a gate electrode 121 and an opaque electrode 131 formed by a metal material in a same layer on the base substrate. A gate insulating layer 122 is formed on gate electrode 121 and opaque electrode 131. Gate insulating layer 122 may include a first via hole that exposes opaque electrode 131. A semiconductor active layer 123 and a photosensitive layer 132 may be formed by an amorphous silicon material in a same layer on gate insulating layer 122. Photosensitive layer 132 is connected with opaque electrode 131 through the first via hole. Source electrode 124 and drain electrode 125 may be formed in a same layer on semiconductor active layer 123 and photosensitive layer 132. Drain electrode 125 is connected with photosensitive layer 132. A resin layer 134 may be formed on source electrode 124 and drain electrode 125. Resin layer 134 may include a second via hole that exposes photosensitive layer 132. A transparent electrode 133 may be formed by a transparent conductive material on resin layer 134. Transparent electrode 133 is connected with photosensitive layer 132 through the second via hole.

In some embodiments, the touch sensing pattern recognition array substrate 01 can further include multiple scanning lines 14 that are connected with and in a same layer as multiple gate electrodes 121, multiple signal lines 15 that are connected with and in a same layer as multiple source electrode 124, and a protecting layer on transparent electrode 133 (not shown in drawings).

Figure 5:
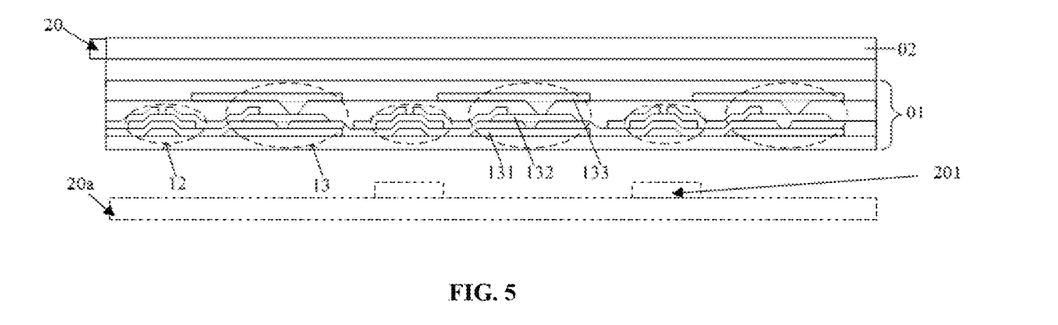
FIG. 5 is a schematic structure diagrams of a touch sensing pattern recognition sensor in accordance with some embodiments of the disclosed subject matter.

Turing to FIG. 5, a schematic structure diagrams of a touch sensing pattern recognition sensor is shown in accordance with some embodiments of the disclosed subject matter. As illustrated, the touch sensing pattern recognition sensor can include a touch sensing pattern recognition array substrate 01 described above, a total internal reflection (TIR) element such as a light guide plate 02, and a light source 20.

In some embodiments, the light guide plate 02 may be placed on a side of touch sensing pattern recognition array substrate 01, e.g., on the side of transparent electrode 133 or the light guide plate 02. The light source 20 can provide an incident light that can be completely reflected by the light guide plate 02. The light source 20 may be placed on the side of opaque electrode 131 of touch sensing pattern recognition array substrate 01.

In some embodiments, the light source 20 may be placed on the side of the light guide plate 02. The light that exits out of light guide plate 02 can transmit through transparent electrode 133 and reach photosensitive layer 132.

In some embodiments, touch sensing pattern recognition array substrate 01 and light guide plate 02 can be bound together by any suitable optical clear resin (OCR) that does not impact the transmitting rate of the light.

Normally, an incident light from the light source 20 at a certain angle can be completely reflected into light guide plate 02. When a finger is in contact with light guide plate 02, multiple ridge lines of the fingerprint in direct contact with light guide plate 02 may impact the complete light reflection. Thus, a portion of the light propagating in light guide plate 02 can be emitted out from light guide plate 02. This portion of light can reach photosensitive parts 13 of sensing units 10 that correspond to the ridge lines of the fingerprint. Going through transparent electrodes 133, this portion of light can change the resistances of photosensitive layers 132, and thereby can change the corresponding electric currents. Because multiple furrow lines of the fingerprint do not directly contact light guide plate 02 and do not impact the complete light reflection, the resistances of photosensitive layers 132 of sensing units 10 that correspond to the furrow lines of the fingerprint do not change, and the corresponding electric currents do not change.

Based on the above configurations, when the electric currents go through multiple thin film transistors 12 and reach multiple signal lines 15, a reading apparatus can identify the furrow lines and the ridge lines of the fingerprint based on the electric currents in multiple signal lines 15.

It should be noted that, the light source 20 should be positioned in a proper place so that the light emitted from the light source 20 can be completely reflected into light guide plate 02. In some embodiments, the light source 20 can be positioned between two adjacent opaque electrodes 131, and can ensure the incident light propagate in light guide plate 02 in the way of complete reflection. In some embodiments, as schematically shown in dashed lines in FIG. 5, a light source 20a can be employed that includes a plurality of emitting elements 201 on one side of the opaque electrode 131 distal to the photosensitive layer 132, where each emitting element 201 is between adjacent opaque electrodes 131.

Figure 6:
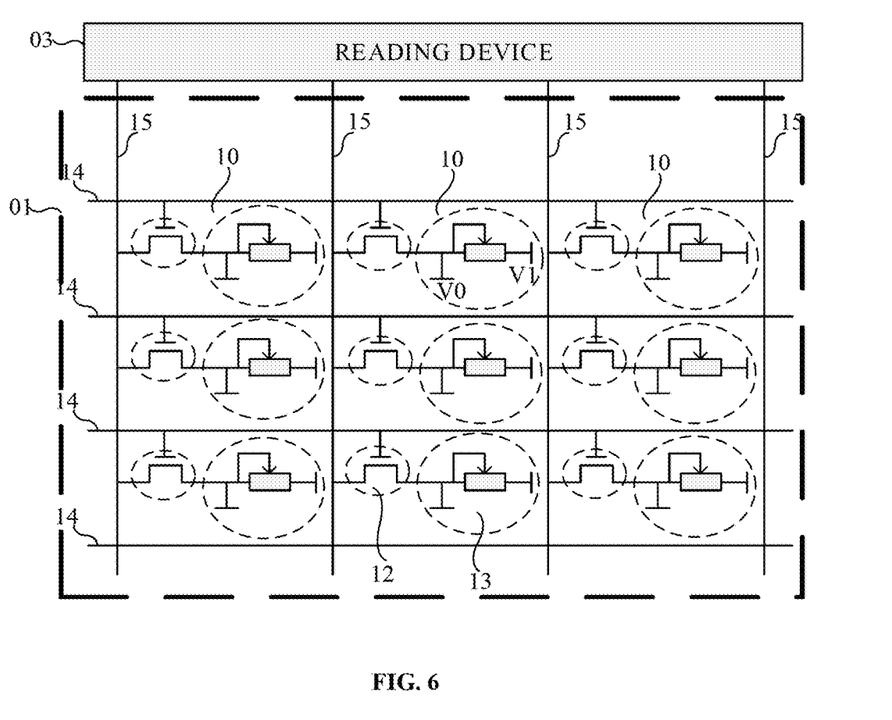
FIG. 6 is a schematic structure diagrams of a touch sensing pattern recognition apparatus in accordance with some embodiments of the disclosed subject matter.

Turning to FIG. 6, a schematic structure diagrams of a touch sensing pattern recognition apparatus is shown in accordance with some embodiments of the disclosed subject matter. As illustrated, the touch sensing pattern recognition apparatus can include a touch sensing pattern recognition sensor described above, and a reading apparatus 03 connected with the multiple signal lines for identifying touch sensing pattern information in response to the received signals from the multiple signal lines.

Specifically, when a fingers is in contact with light guide plate 02, multiple ridge lines of the fingerprint impair the complete light reflection and make a portion of the light to be emitted out from light guide plate 02. This part of light can reach photosensitive parts 13 of sensing units 10 and change the resistances of photosensitive layers 132, and thereby can change the corresponding electric currents. The electric currents can transmit through thin film transistor parts 12 and signal lines 15, and can be received by reading apparatus 03. Reading apparatus 03 may thus identify the positions of the multiple ridge lines of the fingerprint based on the received electric currents.

Since multiple furrow lines of the fingerprint do not directly contact light guide plate 02 and do not change the complete reflection, the resistances of photosensitive layers 132 of sensing units 10 that correspond to the furrow lines of the fingerprint do not change, and the corresponding electric currents do not change. The electric currents can transmit through thin film transistor part 12 and signal lines 15, and can be received by reading apparatus 03. Reading apparatus 03 may thus identify the positions of the multiple furrow lines of the fingerprint based on the electric currents.

In some embodiments, multiple scanning lines 14 may correspond to X coordinates of the multiple sensing units 10, and multiple signal lines 15 may corresponding to Y coordinates of the multiple sensing units 10. Based on the electric currents transmitted from the multiple sensing units 10 in an array, the position information of the multiple ridge lines and multiple furrow lines of the fingerprint information can be identified.

Figure 7:
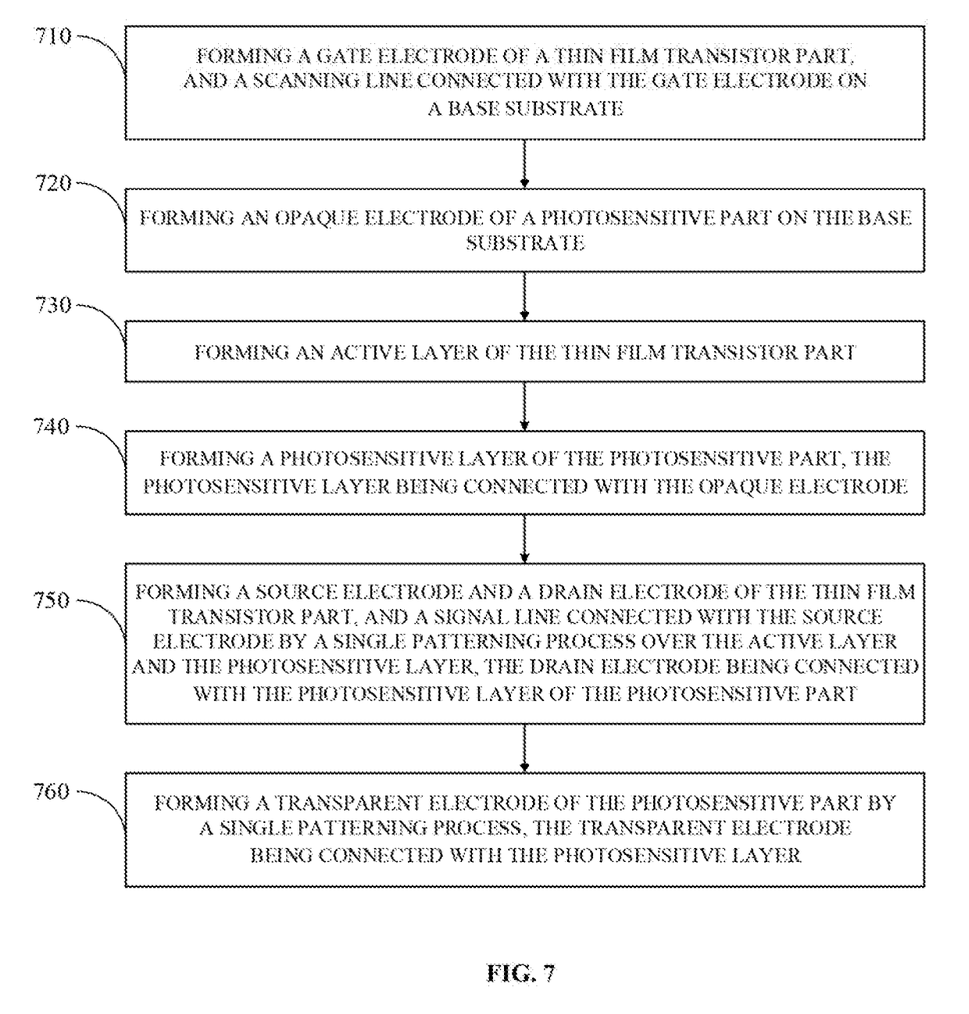
FIG. 7 shows an exemplary method for fabricating a touch sensing pattern recognition array substrate in accordance with some embodiments of the disclosed subject matter.

Turing to FIG. 7, an exemplary method for fabricating a touch sensing pattern recognition array substrate is shown in accordance with some embodiments of the disclosed subject matter. As illustrated in FIG. 7, and referring to FIGS. 3 and 4, the method may include the following steps.

Step 710: forming a gate electrode of a thin film transistor part, and a scanning line connected with the gate electrode on a base substrate;

Step 720: forming an opaque electrode of a photosensitive part on the base substrate;

Step 730: forming an active layer of the thin film transistor part;

Step 740: forming a photosensitive layer of the photosensitive part, the photosensitive layer being connected with the opaque electrode;

Step 750: forming a source electrode and a drain electrode of the thin film transistor part, and a signal line connected with the source electrode by a single patterning process over the active layer and the photosensitive layer, the drain electrode being connected with the photosensitive layer of the photosensitive part; and Step 760: forming a transparent electrode of the photosensitive part by a single patterning process, the transparent electrode being connected with the photosensitive layer.

In some embodiments, the method further includes a step for electrically connecting multiple opaque electrodes that are in a row, and a step for electrically connecting multiple transparent electrodes that are in a row.

In some embodiments, the opaque electrode of photosensitive part, the scanning line, and the gate electrode of the thin film transistor part are formed in a single patterning process. That is, Steps 710 and 720 can be implemented at the same time.

In some embodiments, the photosensitive layer is formed by a material of amorphous silicon or low-temperature polysilicon. The photosensitive layer of the photosensitive part and the active layer of the thin film transistor part are formed by a single patterning process. That is, Steps 730 and 740 can be implemented at the same time.

In some embodiments, the method further includes a step for forming a first insulating layer over the gate electrode, the scanning line, and the opaque electrode in a single patterning processing step. In some embodiments, the method further includes a step for forming a first via hole in the first insulating layer that exposes the opaque electrode, and the photosensitive layer can be connected with the opaque electrode though the first via hole.

In some embodiments, the method further includes a step for forming a second insulating layer over the source electrode, the drain electrode, and the signal line in a single patterning processing step. In some embodiments, the method further includes a step for forming a second via hole in the second insulating layer that exposes the photosensitive layer, and the transparent electrode can be connected with the photosensitive layer through the second via hole.

In some embodiments, the disclosed subject matter provides a method for fabricating a touch sensing pattern recognition sensor, such as the method for fabricating a touch sensing pattern recognition array substrate described in connection with FIG. 7. The method can further include providing a light source and providing a light guide plate on a side of the array substrate. The light guide plate can make an incident light from the light source to propagate in the light guide plate in the way of complete reflection.

In some embodiments, the disclosed subject matter provides a method for fabricating a touch sensing pattern recognition sensor, such as the method for fabricating a touch sensing pattern recognition array substrate described in connection with FIG. 7. The method can further include providing a light source 20 and providing a light guide plate on a side of the array substrate. The light guide plate can make an incident light from the light source 20 to propagate in the light guide plate in the way of complete reflection.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, a touch sensing pattern recognition array substrate, a touch sensing pattern recognition unit, a related touch sensing pattern recognition sensor, a related touch sensing pattern recognition apparatus, and a related fabricating method for fabricating the touch sensing pattern recognition array substrate are provided.

Although the disclosed subject matter has been described and illustrated in the foregoing illustrative embodiments, it is understood that the present disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of the present disclosure.

What is claimed is:

1. A sensing unit on a touch sensing pattern recognition array substrate, comprising:
   a thin film transistor part and a photosensitive part, wherein:
   the photosensitive part comprises:
     an opaque electrode;
     a transparent electrode; and
     a photosensitive layer sandwiched by the opaque electrode and the transparent electrode;
   the thin film transistor part comprises:
     a gate electrode connected with a scanning line;
     a source electrode connected with a signal line; and
     a drain electrode directly physically in contact with the photosensitive layer of the photosensitive part;
   wherein the drain electrode does not contact and is spaced apart from electrodes of the photosensitive part, with the drain electrode, the opaque electrode and the transparent electrode being in different layers of the photosensitive part; and
   wherein the opaque electrode is directly physically in contact with the photosensitive layer through a first via hole and the transparent electrode is directly physically in contact with the photosensitive layer through a second via hole.

2. The sensing unit of claim 1, wherein a projection of the opaque electrode on the array substrate covering a projection of the photosensitive layer on the array substrate.

3. The sensing unit of claim 1, wherein the photosensitive layer is made of a material selected from one of amorphous silicon and low-temperature polysilicon.

4. The sensing unit of claim 1, wherein: the thin film transistor part further comprises an active layer; and the photosensitive layer and the active layer are formed in the same layer and of the same material by a single patterning process.

5. The sensing unit of claim 1, wherein the opaque electrode and the gate electrode are formed in the same layer and of the same material by a single patterning process.

6. The sensing unit of claim 1, wherein the opaque electrode and the source electrode are formed by a single patterning process.

7. The sensing unit of claim 1,
wherein the transparent electrode overlaps with the drain electrode and the transparent electrode has no overlapping region with the source electrode.

8. The sensing unit of claim 1,
further including a resin layer between the transparent electrode and the photosensitive layer and an insulating layer between the opaque electrode and the photosensitive layer, wherein the photosensitive layer is in contact with the opaque electrode through said first via hole which is in the insulating layer and is in contact with the transparent electrode through said second via hole which is in the resin layer.

9. The sensing unit of claim 1, further comprising: a resin layer between the transparent electrode of the photosensitive part and the drain electrode and the source electrode of the thin film transistor part, the transparent electrode being connected with the photosensitive layer through said second via hole which is in the resin layer.

10. A touch sensing pattern recognition array substrate comprising a plurality of sensing units according to claim 1.

11. The array substrate of claim 10, wherein: the opaque electrodes of the plurality of sensing units in a row are connected with each other; and the transparent electrodes of the plurality of sensing units in a row are connected with each other.

12. A touch sensing pattern recognition sensor, comprising: the array substrate according to claim 9; a light total internal reflection element mounted on one side of the transparent electrode distal to the photosensitive layer; and a light source to provide light transmitting into the light total internal reflection element.

13. The touch sensing pattern recognition sensor of claim 12, wherein: the light total internal reflection element comprises a light guide plate; and the light source is configured on one side of the light guide plate.

14. The touch sensing pattern recognition sensor of claim 12, wherein: the light total internal reflection element comprises a light guide plate; the light source comprising a plurality of emitting elements on one side of the opaque electrode distal to the photosensitive layer; and each emitting element is between adjacent opaque electrodes.

15. A touch sensing pattern recognition apparatus, comprising: the touch sensing pattern recognition sensor according to claim 12; and a reading apparatus connected with the signal line for identifying touch sensing pattern information in response to receiving a signal from the signal line.

16. A sensing unit on a touch sensing pattern recognition array substrate, comprising:
a thin film transistor part and a photosensitive part, wherein:
the photosensitive part comprises:
an opaque electrode;
a transparent electrode; and
a photosensitive layer sandwiched by the opaque electrode and the transparent electrode;
the thin film transistor part comprises:
a gate electrode connected with a scanning line;
a source electrode connected with a signal line; and
a drain electrode directly physically in contact with the photosensitive layer of the photosensitive part; and
wherein the transparent electrode overlaps with the drain electrode and the transparent electrode has no overlapping region with the source electrode.

* * * * *